United States Patent
Sakamoto et al.

(10) Patent No.: US 8,195,045 B2
(45) Date of Patent: Jun. 5, 2012

(54) OPTICAL TRANSMISSION MODULE

(75) Inventors: Akira Sakamoto, Kanagawa (JP);
Kazuhiro Sakai, Kanagawa (JP);
Osamu Ueno, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 785 days.

(21) Appl. No.: 12/327,248

(22) Filed: Dec. 3, 2008

(65) Prior Publication Data

US 2009/0196600 A1 Aug. 6, 2009

(30) Foreign Application Priority Data

Feb. 4, 2008 (JP) .................................. 2008-023443

(51) Int. Cl.
*H04B 10/08* (2006.01)

(52) U.S. Cl. .............. 398/23; 398/16; 398/17; 398/182; 398/195

(58) Field of Classification Search .................. 398/182, 398/140, 16, 17, 23, 195, 194, 192, 197
See application file for complete search history.

(56) References Cited

U.S. PATENT DOCUMENTS

| | | | | |
|---|---|---|---|---|
| 4,344,173 A * | 8/1982 | Straus | ...................... | 372/29.011 |
| 4,918,373 A * | 4/1990 | Newberg | ........................ | 324/613 |
| 4,947,459 A * | 8/1990 | Nelson et al. | .................... | 398/26 |
| 6,064,501 A * | 5/2000 | Roberts et al. | .................... | 398/11 |
| 6,259,517 B1 * | 7/2001 | Tedesco et al. | ............... | 356/73.1 |
| 6,302,596 B1 | 10/2001 | Cohen et al. | | |
| 6,310,708 B1 * | 10/2001 | Ota et al. | ........................ | 398/183 |
| 6,600,585 B1 * | 7/2003 | Nakano | ......................... | 398/182 |
| 6,649,896 B2 * | 11/2003 | Birrer et al. | .................... | 250/205 |
| 6,683,836 B2 * | 1/2004 | Miyagawa et al. | ........ | 369/53.26 |
| 6,854,901 B1 | 2/2005 | Ouchi | | |
| 6,891,149 B1 * | 5/2005 | Lewis et al. | .............. | 250/227.14 |
| 7,268,570 B1 * | 9/2007 | Audet et al. | .............. | 324/750.05 |
| 7,564,882 B2 * | 7/2009 | Kim et al. | ...................... | 372/38.1 |
| 2002/0061036 A1 * | 5/2002 | Estevez-Garcia | ............... | 372/26 |
| 2002/0076841 A1 | 6/2002 | Chang et al. | | |
| 2002/0136248 A1 * | 9/2002 | Minneman | ...................... | 372/28 |
| 2004/0001523 A1 * | 1/2004 | Holsinger et al. | .............. | 372/69 |
| 2004/0124788 A1 * | 7/2004 | Ohmori | ......................... | 315/291 |
| 2004/0174915 A1 * | 9/2004 | Sarlet et al. | ...................... | 372/20 |
| 2005/0058389 A1 | 3/2005 | Ouchi | | |
| 2005/0103984 A1 * | 5/2005 | Feng | ............................. | 250/215 |
| 2005/0226636 A1 * | 10/2005 | Hiramatsu et al. | ............ | 398/182 |
| 2006/0250135 A1 * | 11/2006 | Buchwald et al. | ............ | 324/322 |

(Continued)

FOREIGN PATENT DOCUMENTS

JP 02-067832 3/1990

(Continued)

*Primary Examiner* — Kenneth N Vanderpuye
*Assistant Examiner* — Hibret Woldekidan
(74) *Attorney, Agent, or Firm* — Fildes & Outland, P.C.

(57) ABSTRACT

Provided is an optical transmission module that includes: a semiconductor light emitting element for emitting laser light; a first driving unit for providing a first driving current to the semiconductor light emitting element; a switching unit connected between the semiconductor light emitting element and the first driving unit; and a package for accommodating the semiconductor light emitting element, the first driving unit, and the switching unit. The switching unit includes a first input for receiving a first driving current outputted from at least from the first driving unit, a second input for receiving a second driving current for testing the semiconductor light emitting element, and an output connected to the semiconductor light emitting element. The switching unit connects the first input or the second input to the output.

19 Claims, 9 Drawing Sheets

U.S. PATENT DOCUMENTS

| | | | |
|---|---|---|---|
| 2007/0075319 A1* | 4/2007 | Konno et al. | 257/79 |
| 2008/0226288 A1* | 9/2008 | Miller | 398/9 |
| 2009/0051712 A1* | 2/2009 | Arai et al. | 345/690 |
| 2010/0273278 A1* | 10/2010 | Omori | 438/16 |

FOREIGN PATENT DOCUMENTS

| | | |
|---|---|---|
| JP | 04-255922 | 9/1992 |
| JP | 6-504405 | 5/1994 |
| JP | 07-032648 | 2/1995 |
| JP | 11-054839 | 2/1999 |
| JP | 2001-042170 | 2/2001 |
| JP | 2002-280653 | 9/2002 |
| JP | 2004-032198 | 1/2004 |
| JP | 2007-027322 | 2/2007 |
| WO | 92/05608 | 4/1992 |
| WO | 2006/053325 | 5/2006 |

* cited by examiner

10 Optical transmission module

18 VCSEL

| Operation mode | C1 | C2 | C3 |
|---|---|---|---|
| Normal operation mode | H | L | L |
| Test mode | L | H | L |
| Defect determination mode | L | L | H |

FIG. 8   10B Optical transmission module

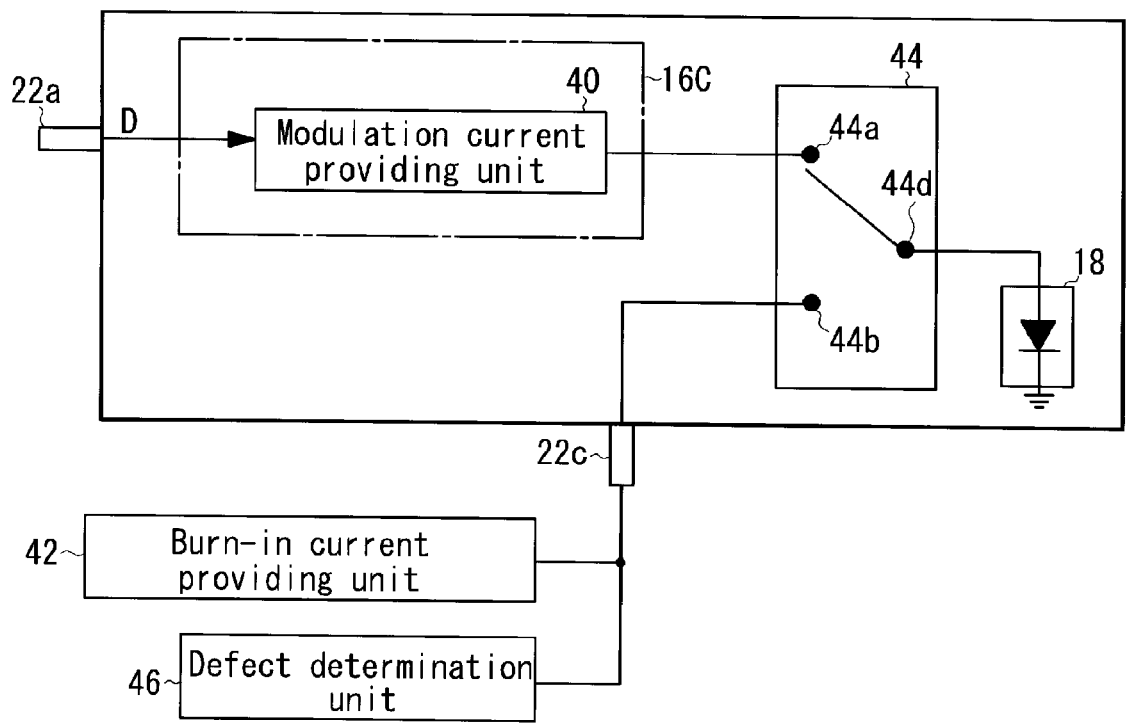

OPTICAL TRANSMISSION MODULE

CROSS-REFERENCE TO RELATED APPLICATION

This application is based on and claims priority under 35 USC 119 from Japanese Patent Application No. 2008-023443 filed Feb. 4, 2008.

BACKGROUND

1. Technical Field

This invention relates to an optical transmission module.

2. Related Art

In technical fields such as optical communication or optical storage, there has been a growing interest in Vertical-Cavity Surface-Emitting Lasers (hereinafter referred to as VCSELs) for use as a light source. VCSELs have excellent characteristics which edge-emitting semiconductor lasers do not have. For example, a VCSEL has a lower threshold current and consumes less power, and VCSELs can be arranged in two-dimensional arrays. Because of these characteristics, applications for an optical transmission module as a light source have been expected in the fields such as optical communication or optical data processing.

In order to achieve a lower cost of an optical transmission module, it is required that a VCSEL and a driving circuit for driving the VCSEL are mounted in a same package. The optical transmission module performs a burn-in test and a defect determination.

SUMMARY

An aspect of the present invention provides an optical transmission module that includes: a semiconductor light emitting element for emitting laser light; a first driving unit for providing a first driving current to the semiconductor light emitting element; a switching unit connected between the semiconductor light emitting element and the first driving unit; and a package for accommodating the semiconductor light emitting element, the first driving unit, and the switching unit. The switching unit includes a first input for receiving a first driving current outputted from at least from the first driving unit, a second input for receiving a second driving current for testing the semiconductor light emitting element, and an output connected to the semiconductor light emitting element. The switching unit connects the first input or the second input to the output.

BRIEF DESCRIPTION OF THE DRAWINGS

Exemplary embodiments of the present invention will be described in detail based on the following figures, wherein:

FIG. 12 is a block diagram illustrating a functional configuration of an optical transmission module according to a sixth example of the present invention.

DETAILED DESCRIPTION

Referring to the accompanying drawings, exemplary embodiments for implementing the present invention will be described. In the specification, an optical transmission module in which an electronic device including a VCSEL is implemented in a CAN package is described as an example. However, it is exemplary only, and a ceramic package or a resin package can be used for the optical transmission module. In addition, the exemplary embodiment of the electronic device including a VCSEL can be varied.

Figure 1:
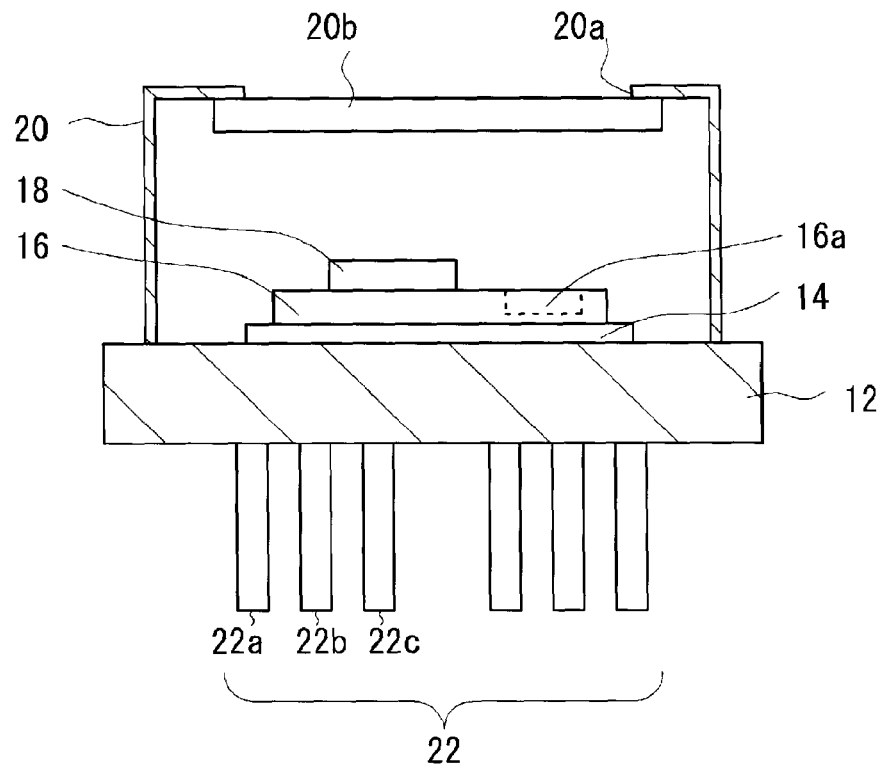
FIG. 1 is a schematic cross sectional view of an optical transmission module according to an example of the present invention.

FIG. 1 is a cross sectional view illustrating a schematic configuration of an optical transmission module according to an example of the present invention. An optical transmission module 10 according to an example may include a disc-shaped metallic stem 12, a submount 14 mounted on an upper surface of the stem 12, an IC chip 16 mounted on the submount 14, a VCSEL 18 mounted on the IC chip 16, a cylindrical cap 20 fixed on the stem 12, plural lead terminals 22 made of a conductive metal and mounted on a bottom surface of the stem 12.

In a center portion of the cap 20, a circular opening 20a may be formed. For closing the opening 20a, a flat glass plate 20b is mounted inside the cap 20. The cap 20 and the flat glass plate 20b forms a preferably hermetically sealed internal space on the stem 12, and protects the IC chip 16 and the VCSEL 18 from external environment. In this example, the flat glass plate is mounted to the CAN package; however, other than the flat plate glass, an optical material such as a spherical lens, a convex lens, a concave lens, or the like may be mounted instead.

Figure 2:
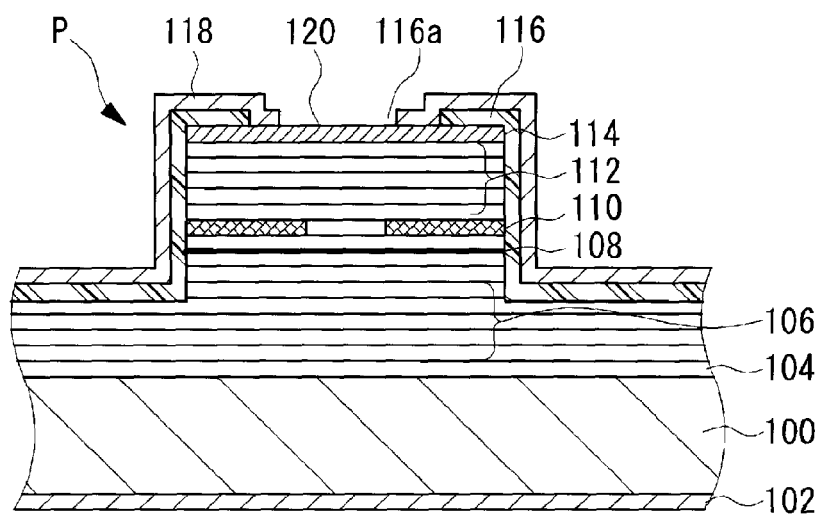
FIG. 2 is a schematic cross sectional view illustrating a configuration of a VCSEL shown in FIG. 1.

FIG. 2 is a cross sectional view of the VCSEL shown in FIG. 1. In this example, a single-spot type VCSEL in which one light emitting spot is formed is illustrated; however, it is exemplary only, and a multi-spot type VCSEL in which plural light emitting spots are formed may be used.

As shown in FIG. 2, the VCSEL 18 may be manufactured as follows. An n-side electrode 102 is formed on a back surface of an n-type GaAs substrate 100. Stacked on the substrate 100 are an n-type GaAs buffer layer 104, an n-type lower Distributed Bragg Reflector (DBR) 106 made of alternately stacked AlGaAs layers each having a different Al-composition, an active region 108, a current confining layer 110 made of p-type AlAs and including an oxidized region on the periphery thereof, a p-type upper DBR 112 made of alternately stacked AlGaAs layers each having a different Al-composition, and a p-type GaAs contact layer 114. A cylindrical post (or mesa) P is formed on the substrate by etching the stacked semiconductor layers.

On the entire surface of the substrate, an interlayer insulating film 116 such as SiON, SiOx, or the like is formed to cover a bottom portion, a side portion, and a portion of top portion of the post P. In the interlayer insulating film 116 at a top portion of the post P, a circular contact hole 116a for exposing the contact layer 114 is formed. At a top portion of the post P, a p-side electrode 118 made of a conductive material is formed. The p-side electrode 118 is ohmic-connected to the contact layer 114 through the contact hole 116a. In a center portion of the p-side electrode 118, a circular emission window for emitting laser light is formed. In this example, the emission window exposes the contact layer 114; however, the emission window may be protected with a dielectric film, alternatively.

The lower DBR 106 and the upper DBR 112 function as a resonator structure, and therebetween, the active region 108 and the current confining layer 110 are interposed. The current confining layer 110 includes an oxidized region formed by selectively oxidizing from a side surface of the post P and a circular conductive region surrounded by the oxidized region, and confines current and light in the conductive region. The center portion of the conductive region coincides with the center of the emission window in the p-side electrode 118. When a forward driving current is injected to the p-side electrode 118 and the n-side electrode 102, laser light of 850 nm, for example, may be emitted from the emission window of the post P perpendicularly to the substrate. The emitted laser light passes through the flat glass plate 20b.

The IC chip 16 includes a silicon substrate on which an integrated circuit is formed. The integrated circuit may include a component such as a driving circuit for driving the VCSEL 18 as described later, and a switching circuit for switching a driving current to the VCSEL. On the silicon substrate, a light receiving element 16a is formed adjacent to the region on which the VCSEL 18 is mounted. The light receiving element 16a receives a portion of laser light emitted from the VCSEL 18, in other words, the light reflected from the flat glass plate 20b, and outputs it as a signal for monitoring optical output.

On a surface of the IC chip 16, an electrode or the like for connecting the n-side electrode 102 of the VCSEL 18 may be formed. The n-side electrode 102 may be electrically connected to the electrode by means of a conductive adhesive, soldering, or other connecting means. In this example, the VCSEL is mounted on the IC chip 16; however, it is not necessarily limited to this example, and the IC chip 16 and a VCSEL chip may be disposed on a submount next to each other.

For the submount 14, preferably, an insulating ceramic substrate (for example, aluminum nitride) having a high thermal conductivity and an excellent dissipation is used. On a surface of the submount 14, a thin film pattern of Ti/Pt/Au or the like may be formed, and the IC chip 16 may be mounted thereon.

In the stem 12, through holes (not shown) for inserting the plural lead terminals 22 are formed. The inner wall of each through hole is covered with glass, which electrically insulates the lead terminals from the stem 12. One end of the lead terminal 22 extends in the internal space, and is electrically connected to a corresponding wiring or electrode of the IC chip 16 or the VCSEL 18 using a connecting medium such as a bonding wire or the like in the internal space.

Figure 3:
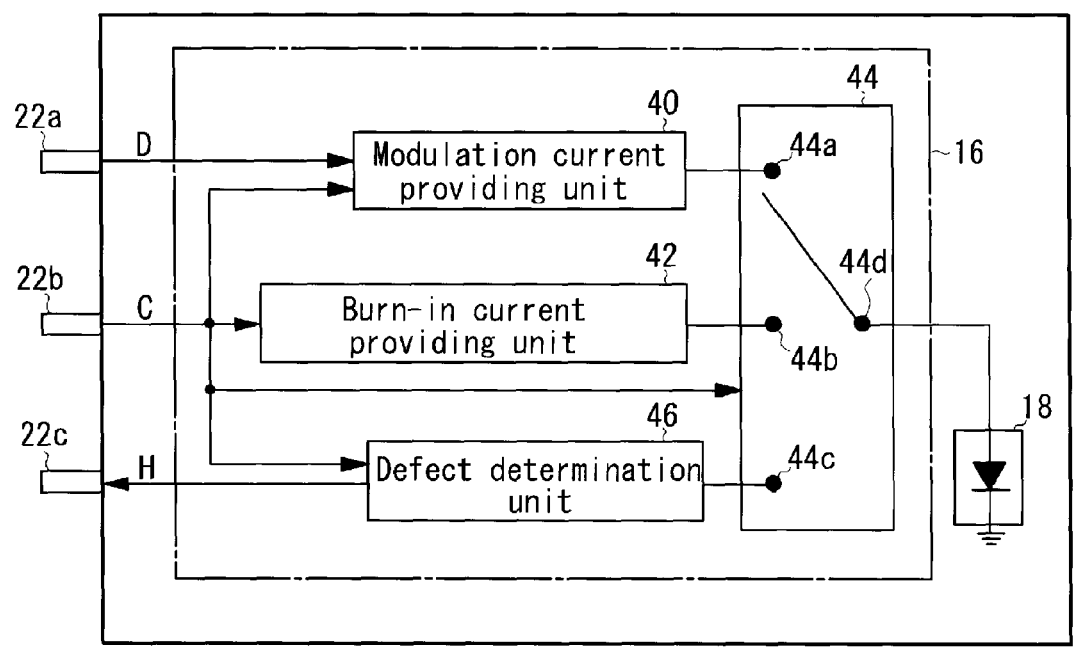
FIG. 3 is a block diagram illustrating a functional configuration of an optical transmission module according to a first example of the present invention.

FIG. 3 is a block diagram illustrating a functional configuration of an optical transmission module. The IC chip 16 includes a modulation current providing unit 40 for driving and modulating the VCSEL 18, a burn-in current providing unit 42 for providing a burn-in driving current to the VCSEL 18 when a burn-in test of the VCSEL is performed, a switching unit 44, and a defect determination unit 46.

To lead terminals 22a and 22b of the optical transmission module 10, a driving signal D and a control signal C are applied, respectively. From a lead terminal 22c, a defect determination signal H determined by the defect determination unit 46 is outputted. The control signal C controls operations of the modulation driving current providing unit 40, the burn-in current providing unit 42, the switching unit 44, and the defect determination unit 46, as described later. Each of the lead terminals 22a, 22b, and 22c is electrically connected to a corresponding electrode of the IC chip.

The modulation driving current providing unit 40 becomes active responsive to the control signal C, and outputs a modulation driving current that corresponds to the driving signal D inputted from the lead terminal 22a to an input 44a of the switching unit 44. The burn-in current providing unit 42 becomes active responsive to the control signal C, and outputs a burn-in driving signal to an input 44b of the switching unit 44. The defect determination unit 46 becomes active responsive to the control signal C, and outputs a measuring signal for defect determination to an input 44c of the switching unit 44. The defect determination unit 46 further determines whether the VCSEL has a failure or not by analyzing the measuring signal, and outputs the defect determination signal H to the lead terminal 22c as a result of the analysis.

The switching unit 44 may select any of the inputs 44a, 44b, and 44c, for example, depending on the voltage level of the control signal C, and connects the selected input to an output 44d. The output 44d is connected to the p-side electrode 118 on an anode side of the VCSEL 18.

The switching unit 44 selects the input 44a when the control signal C is 0 V. By this selection, the driving current outputted from the modulation current providing unit 40 is provided to the VCSEL 18, and the VCSEL 18 emits light in a normal operation mode.

When the control signal C is 1.2 V, the switching unit 44 selects the input 44b. By this selection, the burn-in driving current outputted from the burn-in current providing unit 42 is provided to the VCSEL 18, and a burn-in test of the VCSEL 18 is performed. In the burn-in test, the optical transmission module 10 is held in an oven at a high temperature of about 120 degrees centigrade in a state where the IC chip 16 and the VCSEL 18 are mounted in the optical transmission module 10 as shown in FIG. 1. The VCSEL 18 is driven for a constant time period by a burn-in test driving current that is about four times the driving current in the normal operation mode. During the burn-in test, the modulation current providing unit 40 is electrically disconnected by the switching unit 44, which prevents the burn-in driving current from leaking into the modulation current providing unit 44. Therefore, the VCSEL can be tested under an accurate test condition. In addition, the modulation current providing unit 40 is protected from the burn-in driving current.

When the control signal C is 3.3 V, the switching unit 44 selects the input 44c. By this selection, the measuring signal of the defect determination unit 46 is provided to the VCSEL 18. The measuring signal includes any of a forward current, a forward voltage, or a reverse current, and compares operating conditions of the VCSEL at an initial state and operating conditions of the VCSEL after the burn-in test, and determines whether the VCSEL has a failure or not according to predetermined defect determination conditions. For example, the current value in a case where a minute forward voltage is applied, or the current value in a case where a reverse voltage is applied may be measured. Although the current is a minute current of equal to or less than 1 µA, the switching unit 44 electrically disconnects the modulation current providing unit 40 and the burn-in current providing unit 42 when a defect determination is performed, and therefore leakage of the measuring signal can be prevented and degradation in S/N ratio of the measuring signal can be prevented, and a defect of the VCSEL can be accurately determined. In addition, by combining with an output signal of the light receiving element 16a formed in the IC chip, for example, the optical output at an oscillation threshold current value or at a constant current value can be measured for use in the defect determination.

As described above, by inputting the control signal C from outside of the optical transmission module to the lead terminal 22b, the optical transmission module can select a desired operation mode from plural operation modes. In other words, any mode can be selected from: the normal mode in which the VCSEL 18 is driven by a driving current from the modulation driving current providing unit 40; the test mode in which the VCSEL 18 is driven by a burn-in driving current from the burn-in driving current providing unit 42; or the defect determination mode in which the VCSEL 18 is driven by a measuring signal from the defect determination unit 46 for determining a defect of the VCSEL.

The defect determination mode is preferably performed after the test mode; however, it is not limited to the particular order. For example, during the normal mode, by intermittently switching to the defect determination mode for performing a defect determination, an advance notice of degradation and a defect of the VCSEL can be provided.

Figure 4:
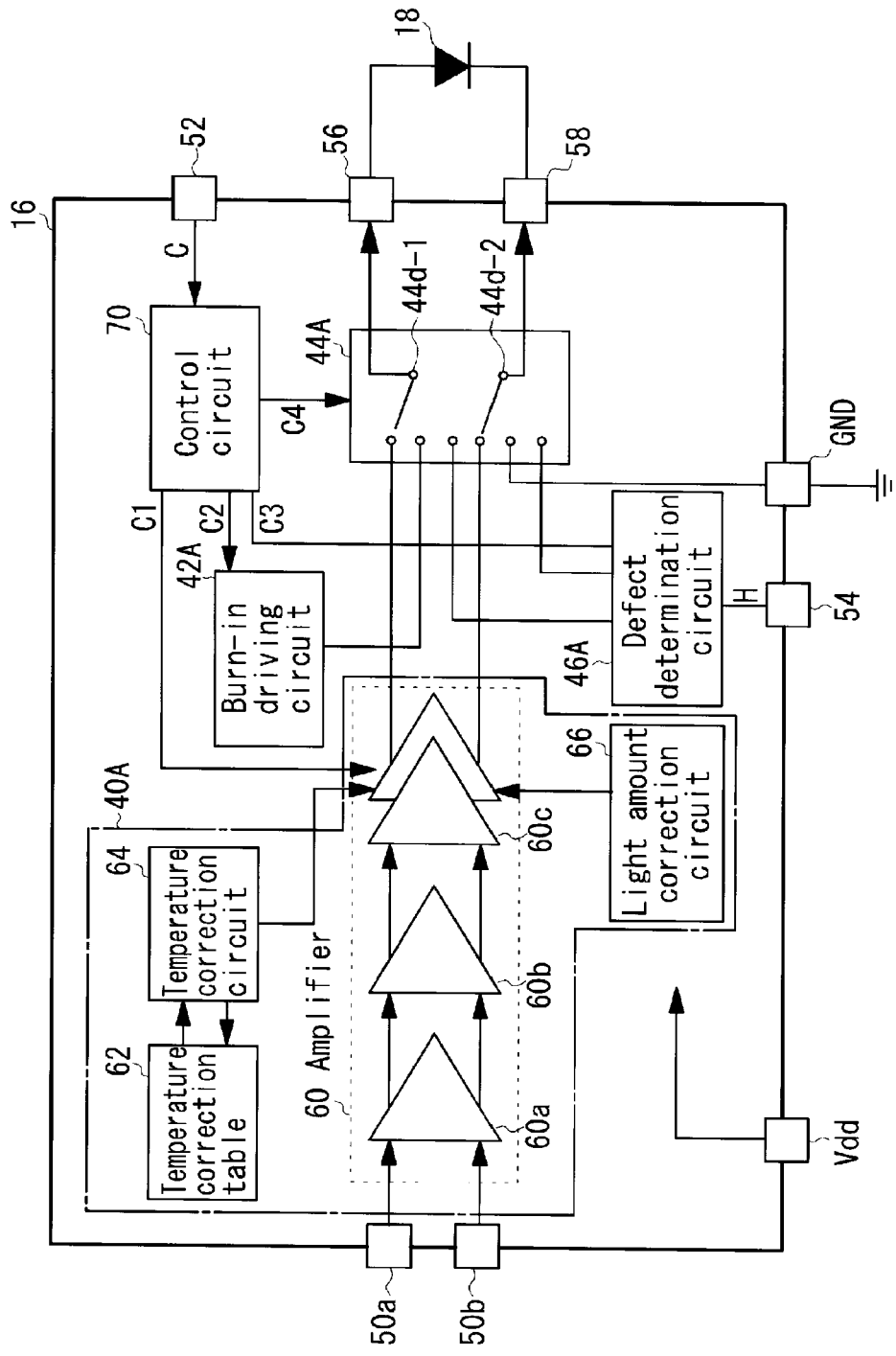
FIG. 4 illustrates a detailed circuit configuration of the optical transmission module shown in FIG. 3.

FIG. 4 illustrates a detailed circuit configuration example of the IC chip shown in FIG. 3. Formed in the IC chip 16 are: input terminals 50a and 50b for inputting a differential input signal being a driving signal, an input terminal 52 for inputting the control signal C, an output terminal 54 for outputting the defect determination signal H, an anode output terminal 56 connected to the p-side electrode of the VCSEL, a cathode output terminal 58 connected to the n-side electrode, a Vdd terminal for providing a power source, and a GND terminal for grounding. These input and output terminals are electrically connected to corresponding lead terminals 22 (22a, 22b, and 22c).

A modulation current providing circuit 40A includes an amplifier 60 for amplifying differential input signals inputted from the input terminals 50a and 50b, a temperature correction table 62 that stores temperature correction data for performing temperature compensation of the VCSEL, a temperature correction circuit 64 for controlling the amplifier 60 based on the temperature correction data in the temperature correction table 62, and a light amount correction circuit 66 for correcting the amount of light based on the optical output received by the light receiving element 16a. The amplifier 60 is a multi-stage amplifier including an input amplifier 60a for amplifying the differential input signal, a preamplifier 60b, and an output amplifier 60c.

VCSELs have a characteristic that the optical output decreases as the operating temperature rises, and the optical output increases as the operating temperature lowers. Therefore, the temperature correction circuit 64 reads the temperature correction data that corresponds to the operating temperature from the temperature correction table 62, and adjusts the gain of the output amplifier 60C depending on the temperature correction data. The light amount correction circuit 66 feedback-controls the output amplifier 60C to the optical output monitored by the light receiving element 16a such that the optical output of the VCSEL is kept constant.

A control circuit 70 generates internal control signals C1, C2, C3, and C4 responsive to the control signal C inputted from the input terminal 52. The internal control signal C1 is provided to the amplifier 60. When the internal control signal C1 is H level, the amplifier 60 becomes active and outputs a driving current responsive to the differential input signal. When the internal control signal C1 is L level, the amplifier 60 becomes inactive, and stops providing the driving current.

The internal control signal C2 is provided to a burn-in driving circuit 42A. When the internal control signal C2 is H level, the burn-in driving circuit 42A becomes active and outputs a burn-in driving current. When the internal control signal C2 is L level, the burn-in driving circuit 42A becomes inactive and stops providing the burn-in driving current.

Figures 5, 6:
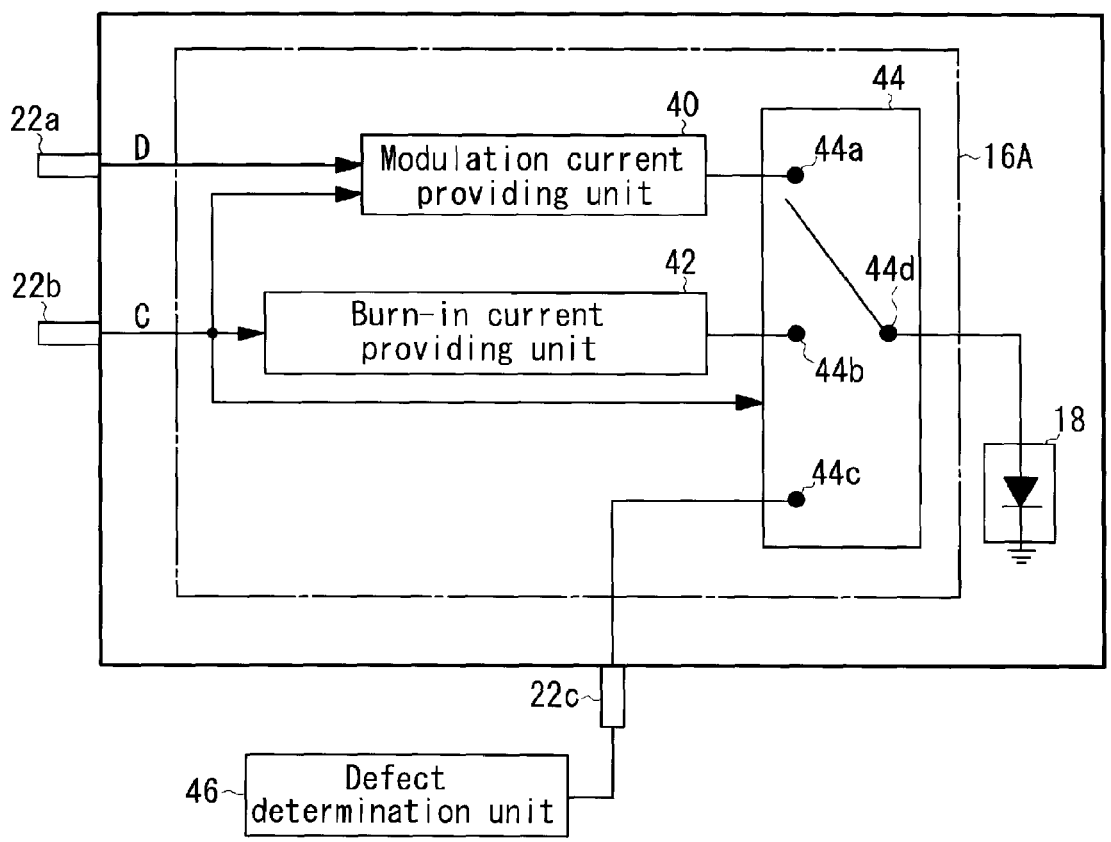
FIG. 5 is a table illustrating the relation between internal control signals and operation modes.
FIG. 6 is a block diagram illustrating a functional configuration of an optical transmission module according to a second example of the present invention.

The internal control signal C3 is provided to a defect determination circuit 46A. When the internal control signal C3 is H level, the defect determination circuit 46A becomes active and outputs a measuring signal. The defect determination circuit 46A further analyzes the current values or the like of the measuring signal, determines whether the VCSEL has a defect, and provides the defect determination signal H as a result of the determination to the output terminal 54. When the internal control signal C3 is L level, the defect determination circuit 46A becomes inactive and stops providing the measuring signal. FIG. 5 illustrates the relation between the internal control signals C1, C2, C3, and the operation modes.

The internal control signal C4 is provided to a switching circuit 44A. The internal control signal C4 controls the switching operations of the switching circuit 44A, depending on the voltage level of the control signal C described above and corresponding to each operation mode. In the normal mode, an input that receives the driving current outputted from the amplifier 60 is connected to outputs 44d-1 and 44d-2. In the test mode, an input that receives the driving current outputted from the burn-in driving circuit 42A is connected to the outputs 44d-1 and 44d-2. In the defect determination mode, an input that receives the measuring signal outputted from the defect determination circuit 46A is connected to the output 44d-1. The output 44d-1 of the switching circuit 44A is connected to the anode output terminal 56, and the output 44d-2 is connected to the cathode output terminal 58. The VCSEL 18 is driven by the voltage and current provided from the anode output terminal 56 and the cathode output terminal 58.

By screening the optical transmission module configured as described above using the burn-in test and the defect determination prior to shipment, generation of early failures associated with the VCSEL can be reduced.

The process for testing early failures is preferably performed in a finished form when possible. This is because, if the burn-in test is performed at a halfway of the manufacturing, the VCSEL may be damaged in a subsequent process, especially in handing the VCSEL chip cut out from the semiconductor substrate, and an early failure caused by the damage cannot be eliminated.

In general, when a driving circuit and a VCSEL are implemented in a package, if the driving circuit and the VCSEL are kept electrically connected each other, a test of a finished form cannot be performed accurately, and thus the VCSEL needs to be tested before the VCSEL is packaged in the finished form. In this case, early failures due to the factors as described above cannot be eliminated, and resulting that it is difficult to reduce early failures caused after shipping.

In the examples of the invention, the driving circuit and the VCSEL can be disconnected by the switching unit.

A second example of the present invention will be now described. FIG. 6 is a block diagram illustrating a functional configuration of an optical transmission module according to the second example. Same reference numerals have been retained for similar configurations to those of the first example, and explanation thereof are not described herein. The second example differs from the first example in that an IC chip 16A does not include a defect determination unit. An optical transmission module 10A includes a lead terminal 22c for inputting a measuring signal externally provided from the defect determination unit 46. When a defect determination of the VCSEL is performed, the switching unit 44 connects the input 44c to the output 44d responsive to the control signal C. By this switching, the measuring signal inputted from the lead terminal 22c is provided to the VCSEL 18. The defect determination unit 46 analyzes the current value or the like of the measuring signal flowing through the lead terminal 22c for determining whether the VCSEL has a failure.

Figure 7:
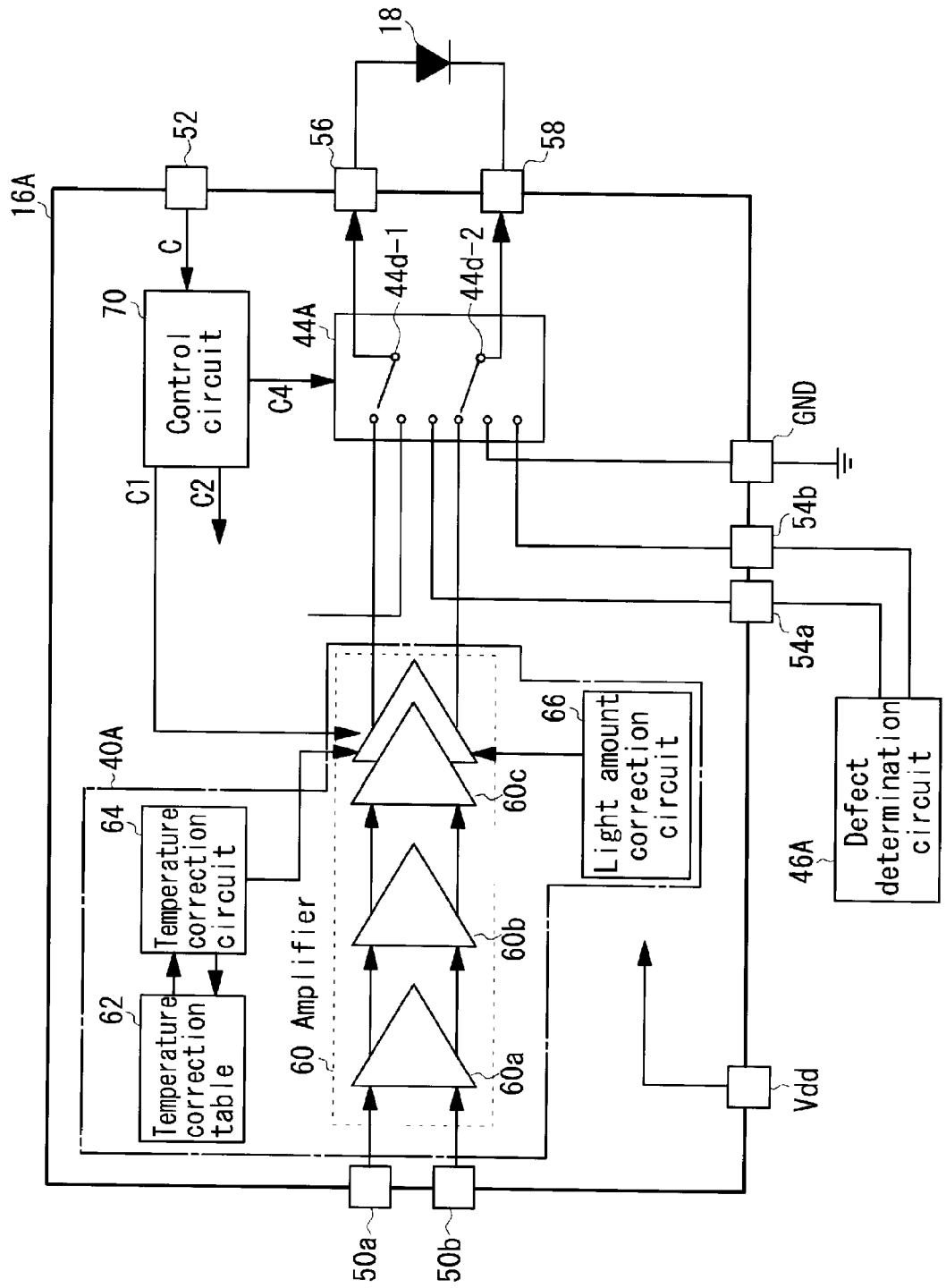
FIG. 7 is a block diagram illustrating a detailed circuit configuration of the optical transmission module shown in FIG. 6.

FIG. 7 is a block diagram illustrating a detailed circuit configuration example of the IC chip shown in FIG. 6. As shown in FIG. 7, the IC chip 16A has connection terminals 54a and 54b being connected to a defect determination circuit 46A. When the defect determination mode is performed, a measuring signal is provided to the VCSEL 18 through the connection terminals 54a and 54b, and the switching circuit 44A.

Figure 8:
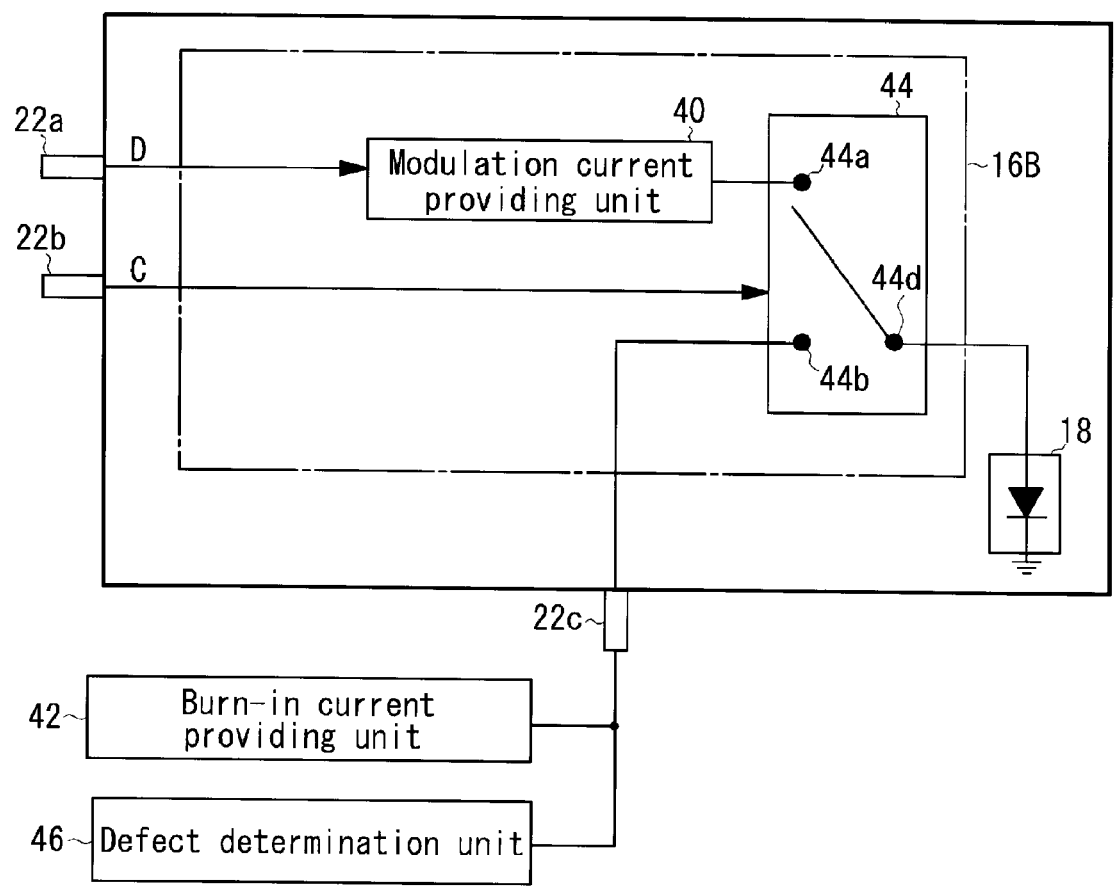
FIG. 8 is a block diagram illustrating a functional configuration of an optical transmission module according to a third example of the present invention.

A third example of the present invention will be now described. FIG. 8 is a block diagram illustrating a functional configuration of an optical transmission module according to the third example. In an optical transmission module 10B according to the third example, an IC chip 16B includes the modulation current providing unit 40 and the switching unit 44. The burn-in current providing unit 42 and the defect determination unit 46 are connected to the lead terminal 22c of the optical transmission module.

Figure 9:
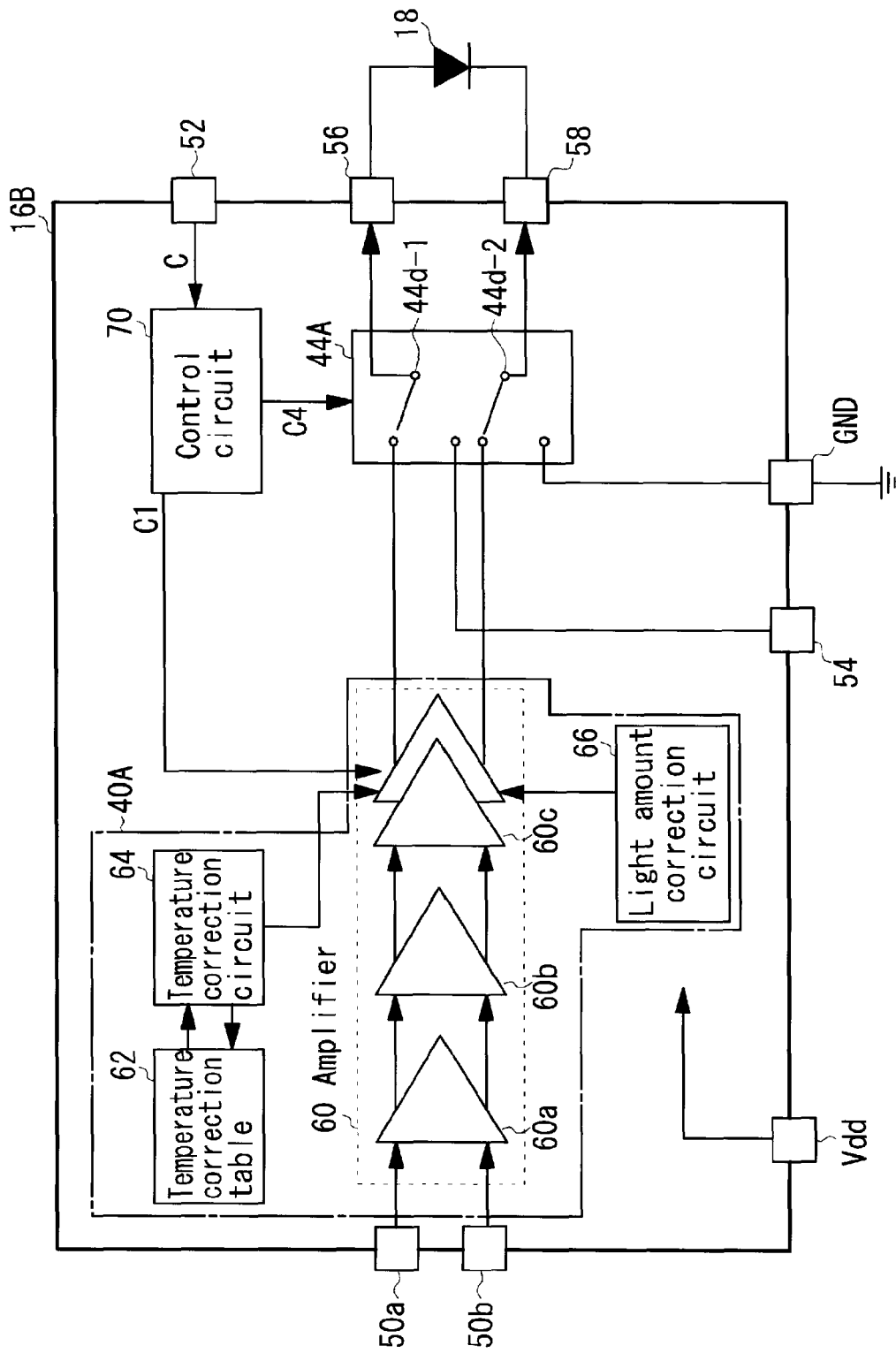
FIG. 9 is a block diagram illustrating a detailed circuit configuration of the optical transmission module shown in FIG. 8.

When the normal mode is selected by the control signal C, a driving current outputted from the modulation current providing unit 40 is provided to the VCSEL through the switching unit 44. In other modes than the normal mode, the switching unit 44 disconnects the input 44a from the output 44d, and connects the input 44b to the output 44d. When a burn-in test is performed, a burn-in driving current outputted from the burn-in current providing unit 42 is externally provided to the VCSEL 18 through the lead terminal 22c and the switching unit 44. When a defect determination is performed, a measuring signal outputted from the defect determination unit 46 is externally provided to the VCSEL 18 through the lead terminal 22c and the switching unit 44. As described above, it is prevented that the burn-in driving current and the measuring signal from leaking into the modulation current providing unit 40 during a burn-in test or a defect determination. FIG. 9 illustrates a detailed circuit configuration example of the IC chip shown in FIG. 8. Although the burn-in driving circuit 42A and the defect determination circuit 46A are not shown, the outputs from these circuits are connected to the connection terminal 54 of the IC chip 16B.

Figure 10:
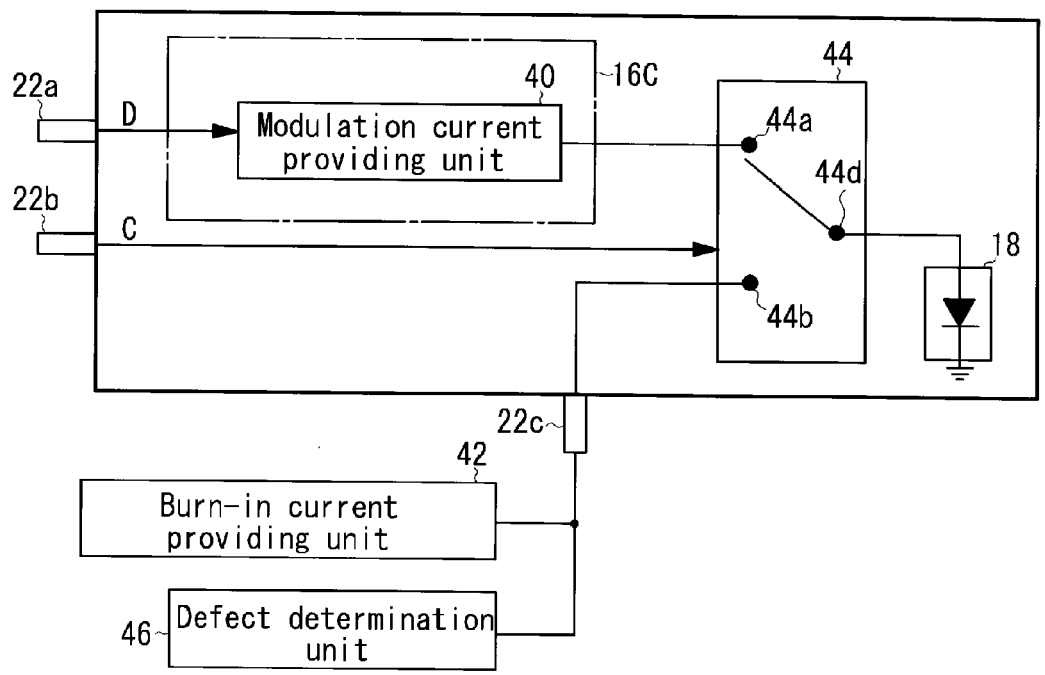
FIG. 10 is a block diagram illustrating a functional configuration of an optical transmission module according to a fourth example of the present invention.

FIG. 10 is a block diagram illustrating of a functional configuration of an optical transmission module according to a fourth example of the present invention. In an optical transmission module 10C according to the fourth example, the switching unit 44 is not formed in an IC chip 16C, and formed isolated from the IC chip 16C. The switching unit 44 may be disposed on the submount shown in FIG. 1 and spaced from the IC chip 16, and may use an electromagnetic relay that performs a switching operation responsive to the control signal C, for example. Other arrangement is same as in the third example.

Figure 11:
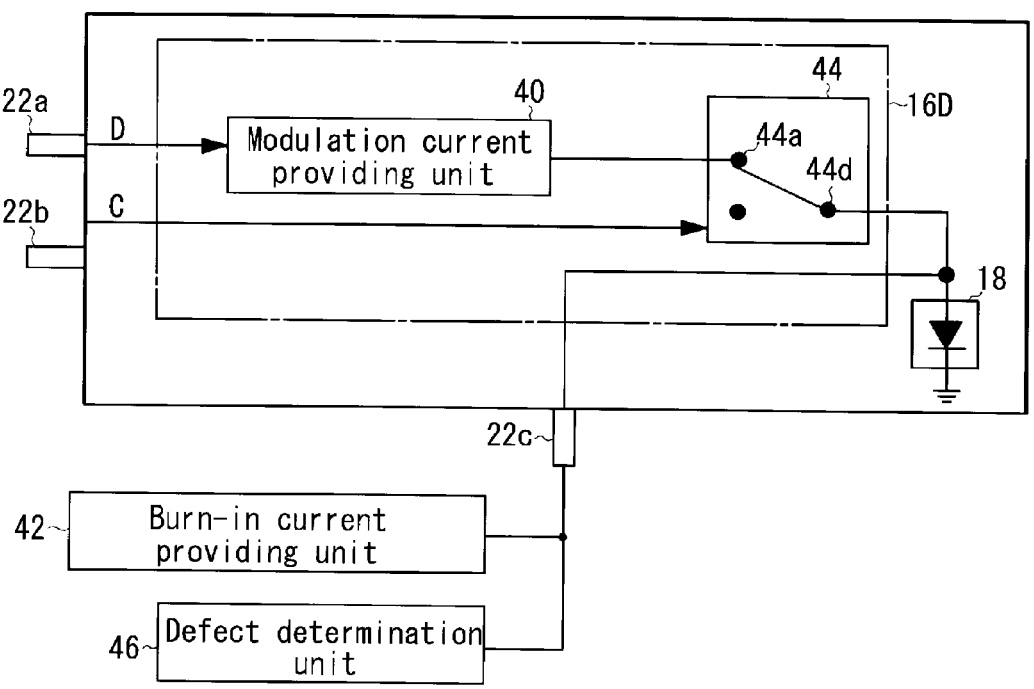
FIG. 11 is a block diagram illustrating a functional configuration of an optical transmission module according to a fifth example of the present invention.

FIG. 11 is a block diagram illustrating a functional configuration of an optical transmission module according to a fifth example of the present invention. In an optical transmission module 10D according to the fifth example, a burn-in driving current or a measuring signal provided from the lead terminal 22c is not inputted to the switching unit 44, and connected directly to an anode electrode (p-side electrode) of the VCSEL 18. When the normal mode is performed in the optical transmission module 10D, the driving signal D is inputted to the modulation current providing unit 40 through the lead terminal 22a, and the modulation current providing unit 40 outputs a driving current. Responsive to a control signal C inputted from the lead terminal 22c, the switching unit 44 connects the input 44a that receives a driving current outputted from the modulation current providing unit 40 to the output 44d, which drives the VCSEL 18. In other modes than the normal mode, the switching unit 44 disconnects the input 44a connected to the output of the modulation current providing unit 40 from the output 44d. This prevents the burn-in driving current or the measuring signal from electrically interfering with the modulation current providing unit 40 during a burn-in test or a defect determination.

FIG. 12 is a block diagram illustrating a functional configuration of an optical transmission module according to a sixth example of the present invention. In an optical transmission module 10E according to the sixth example, the IC chip 16C does not include the switching unit as in the case of the fourth example. Also, the optical transmission module 10E does not include the lead terminal 22b for inputting the control signal C. The switching unit 44 may be made of, for example, a jumper switch, a DIP switch or the like, and is implemented in the optical transmission module 10E. When a burn-in test or a defect determination is performed, the switching operation of the switching unit 44 is performed from outside of the optical transmission module 10E such that the input 44b connected to the lead terminal 22c is connected to the output 44d.

While exemplary embodiments of the present invention have been described in detail, the present invention is not intended to be limited to specific examples and various changes and modifications can be made within the scope of the invention set forth in the appended claims.

An optical transmission module according to the present invention can be applied to a transmission module used in various fields such as optical transmission.

What is claimed is:
1. An optical transmission module comprising: a semiconductor light emitting element for emitting laser light;
a first driving unit for providing a first driving current to the semiconductor light emitting element;
a switching unit connected between the semiconductor light emitting element and the first driving unit; and
a package for accommodating the semiconductor light emitting element, the first driving unit, and the switching unit,
the switching unit comprising a first input for receiving the first driving current outputted from at least from the first driving unit, a second input for receiving a second driving current for performing a test of the semiconductor light emitting element, a third input for receiving a measuring signal for determining a defect of the semiconductor light emitting element, and an output connected to the semiconductor light emitting element, and the switching unit switching a Connection of at least one of the first input, the second input and the third input to the output, the switching unit connecting the third input to the output in determining the defect of the semiconductor light emitting element.

2. The optical transmission module according to claim 1, further comprising a first external terminal for receiving the second driving current, wherein the second input receives the second driving current through the first external terminal.

3. The optical transmission module according to claim 1, further comprising a second driving unit for providing the second driving current to the semiconductor light emitting element, wherein the second input receives the second driving current outputted from the second driving unit.

4. The optical transmission module according to claim 1, further comprising a second external terminal for receives the measuring signal, wherein the third input receives the measuring signal through the second external terminal.

5. The optical transmission module according to claim 4, further comprising a defect determination unit for providing the measuring signal to the semiconductor light emitting element, wherein the third input receives the measuring signal outputted from the defect determination unit.

6. The optical transmission module according to claim 5, further comprising a third external terminal for outputting a defect determination signal determined by the defect determination unit.

7. The optical transmission module according to claim 6, further comprising a fourth external terminal for receiving a control signal that controls a switching operation of the switching unit.

8. The optical transmission module according to claim 1, further comprising a fourth external terminal for receiving a control signal that controls a switching operation of the switching unit.

9. The optical transmission module according to claim 1, further comprising a defect determination unit, wherein the first driving unit, the second driving unit, and the defect determination unit operate in response to a control signal that controls a switching operation of the switching unit.

10. The optical transmission module according to claim 1, further comprising a defect determination unit, wherein the first driving unit, the second driving unit, the defect determination unit, and the switching unit are formed in a same semiconductor integrated circuit.

11. The optical transmission module according to claim 1, wherein the test is a burn-in test.

12. The optical transmission module according to claim 11, wherein the second driving current is greater than the first driving current.

13. The optical transmission module according to claim 1, wherein the measuring signal is any of a forward current, a forward biased voltage, a reverse current, and a reverse biased voltage.

14. An optical transmission module comprising:
a first substrate;
a semiconductor laser device for emitting laser light formed on the first substrate;
a second substrate including a defect determination circuit for determining a defect of the semiconductor laser device;
a first driving circuit for providing a first driving current to the semiconductor laser device, and a switching circuit electrically connected between the first driving circuit and the semiconductor laser device, the first driving circuit and the switching circuit being formed on the second substrate; and
a first external terminal for inputting a control signal, the defect determination circuit outputting a measuring signal depending on the control signal,
the switching circuit comprising a first input for receiving the first driving current at least from the first driving circuit, a second input for receiving a second driving current for
testing the semiconductor laser device, a third input for receiving the measuring signal from the defect determination circuit, and an output electrically connected to the semiconductor laser device, the switching circuit switching a connection of at least one of the first input, the second input and the third input to the output depending on the control signal inputted from the first external terminal.

15. The optical transmission module according to claim 14, wherein the second substrate further includes a second driving circuit for providing the second driving current to the semiconductor laser device, and the second driving circuit outputs the second driving current to the second input of the switching circuit depending on the control signal.

16. The optical transmission module according to claim 15, wherein the first driving circuit stops to provide the first driving current responsive to the control signal, when the second driving current is outputted from the second driving circuit.

17. The optical transmission module according to claim 14, further comprising a second external terminal for outputting a defect determination signal that indicates a result of the defect determination by the defect determination circuit.

18. The optical transmission module according to claim 14, further comprising a second driving circuit for providing the second driving current, wherein the first driving circuit and the second driving circuit stop to provide the first driving current and the second driving current responsive to the control signal, when the measuring signal is outputted from the defect determination unit.

19. The optical transmission module according to claim 14, further comprising a stem and a cap for forming an internal space on the stem, wherein the first substrate and the second substrate are implemented in the internal space, at least the first external terminal is mounted on the stem, and a window for emitting the laser light of the semiconductor laser device is formed on a surface of the cap.

* * * * *